(12) United States Patent
Wang et al.

(10) Patent No.: US 10,923,007 B2
(45) Date of Patent: Feb. 16, 2021

(54) SHIFT REGISTER UNIT, GATE DRIVE CIRCUIT, AND DISPLAY DEVICE

(71) Applicants: Hefei BOE Optoelectronics Technology Co., Ltd., Hefei (CN); BOE TECHNOLOGY GROUP CO., LTD., Beijing (CN)

(72) Inventors: Ying Wang, Beijing (CN); Meng Li, Beijing (CN); Wei Xue, Beijing (CN); Hongmin Li, Beijing (CN)

(73) Assignees: Hefei BOE Optoelectronics Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/504,419

(22) Filed: Jul. 8, 2019

(65) Prior Publication Data

US 2020/0168142 A1 May 28, 2020

(30) Foreign Application Priority Data

Nov. 22, 2018 (CN) .......................... 201811398587.0

(51) Int. Cl.
*G11C 19/00* (2006.01)
*G09G 3/20* (2006.01)
*G11C 19/28* (2006.01)
*G09G 3/36* (2006.01)

(52) U.S. Cl.
CPC ............. *G09G 3/20* (2013.01); *G09G 3/3677* (2013.01); *G11C 19/28* (2013.01); *G11C 19/287* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 2016/0117963 | A1* | 4/2016 | Chung | G11C 19/28 345/208 |
| 2018/0226008 | A1* | 8/2018 | Zhou | G11C 19/28 |
| 2019/0311691 | A1* | 10/2019 | Feng | G11C 19/28 |
| 2020/0066209 | A1* | 2/2020 | Zhang | G09G 3/3266 |

\* cited by examiner

*Primary Examiner* — Tuan T Lam
(74) *Attorney, Agent, or Firm* — Thomas|Horstemeyer, LLP

(57) ABSTRACT

The present disclosure relates to the field of display technologies and provides a shift register unit. The shift register unit includes an input circuit, a pull-up circuit, an output circuit, an auxiliary circuit, a pull-down circuit, a first storage capacitor, and a second storage capacitor. The auxiliary circuit is coupled to a first clock signal terminal, a second clock signal terminal, an input terminal and a first output terminal. The second storage capacitor is coupled between a first node and a pull-up node.

20 Claims, 5 Drawing Sheets

SHIFT REGISTER UNIT, GATE DRIVE CIRCUIT, AND DISPLAY DEVICE

CROSS-REFERENCE TO RELATED APPLICATION

This application is based upon, and claims the benefit of and priority to, Chinese Patent Application No. 201811398587.0, filed on Nov. 22, 2018, the entire contents thereof being incorporated herein by reference.

TECHNICAL FIELD

The present disclosure generally relates to the field of display technologies and, more particularly, to a shift register unit, a gate drive circuit, and a display device.

BACKGROUND

With the pursuit of low costs of flat panel display devices and the improvement of manufacturing processes, gate drive technologies are employed in increasingly more flat panel display devices, and a plurality of shift register units may be included in a gate drive circuit.

However, in actual production process, one or more thin film transistors (TFTs) and storage capacitors in the shift register units are prone to various defects, leading to failure of implementation of shift function, which may result in entire panels being unable to display properly.

Therefore, it is necessary to propose a new shift register unit, a new gate drive circuit, and a new display device.

The above-mentioned information disclosed in this Background section is only for the purpose of enhancing the understanding of the background of the present disclosure and may therefore include information that does not constitute a prior art that is known to those of ordinary skill in the art.

SUMMARY

The present disclosure provides a shift register unit, a gate drive circuit, and a display device.

According to an aspect of the present disclosure, there is provided a shift register unit, which includes:

an input circuit coupled to an input terminal, a pull-up node, and a first clock signal terminal, and configured to transmit an input signal to the pull-up node in response to a first clock signal;

a first storage capacitor coupled between the pull-up node and a pull-down node;

a pull-up circuit coupled to the pull-up node, a second clock signal terminal, and a first output terminal, and configured to transmit a second clock signal to the first output terminal in response to a signal from the pull-up node;

an output circuit coupled to the second clock signal terminal, the pull-up node, and a second output terminal, and configured to transmit the second clock signal to the second output terminal in response to the signal from the pull-up node;

an auxiliary circuit coupled to the first clock signal terminal, the second clock signal terminal, the input terminal, and the first output terminal and configured to transmit the input signal to a first node in response to the first clock signal and transmit the second clock signal to the first output terminal in response to a signal from the first node;

a second storage capacitor coupled between the pull-up node and the first node; and a pull-down circuit coupled to a third clock signal terminal, a first power signal terminal, the pull-down node, and the second output terminal, and configured to transmit a first power signal to the pull-down node and the second output terminal in response to a third clock signal.

In an exemplary embodiment of the present disclosure, the input circuit includes:

a first switching element, a control terminal of the first switching element being coupled to the first clock signal terminal, a first terminal of the first switching element being coupled to the input terminal, and a second terminal of the first switching element being coupled to the pull-up node.

In an exemplary embodiment of the present disclosure, the pull-up circuit includes:

a second switching element, a control terminal of the second switching element being coupled to the pull-up node, a first terminal of the second switching element being coupled to the second clock signal terminal, and a second terminal of the second switching element being coupled to the pull-down node.

In an exemplary embodiment of the present disclosure, the output circuit includes:

a third switching element, a control terminal of the third switching element being coupled to the pull-up node, a first terminal of the third switching element being coupled to the second clock signal terminal, and a second terminal of the third switching element being coupled to the second output terminal.

In an exemplary embodiment of the present disclosure, the auxiliary circuit includes:

a fourth switching element, a control terminal of the fourth switching element being coupled to the first clock signal terminal, a first terminal of the fourth switching element being coupled to the input terminal, and a second terminal of the fourth switching element being coupled to the first node; and a fifth switching element, a control terminal of the fifth switching element being coupled to the first node, a first terminal of the fifth switching element being coupled to the second clock signal terminal, and a second terminal of the fifth switching element being coupled to the first output terminal.

In an exemplary embodiment of the present disclosure, the pull-down circuit includes:

an eleventh switching element, a control terminal of the eleventh switching element being coupled to the third clock signal terminal, a first terminal of the eleventh switching element being coupled to the pull-down node, and a second terminal of the eleventh switching element being coupled to the first power signal terminal; and a twelfth switching element, a control terminal of the twelfth switching element being coupled to the third clock signal terminal, a first terminal of the twelfth switching element being coupled to the second output terminal, and a second terminal of the twelfth switching element being coupled to the first power signal terminal.

In an exemplary embodiment of the present disclosure, the shift register unit further includes:

a control circuit coupled to the pull-up node and a power signal terminal, and configured to transmit the first power signal to the pull-up node in response to a the third clock signal.

In an exemplary embodiment of the present disclosure, the control circuit includes:

a sixth switching element, a control terminal of the sixth switching element being coupled to the pull-up node, a first terminal of the sixth switching element being coupled to the third clock signal terminal, and a second terminal of the sixth switching element being coupled to a second node;

a seventh switching element, a control terminal of the seventh switching element being coupled to the pull-up node, a first terminal of the seventh switching element being coupled to the second node, and a second terminal of the seventh switching element being coupled to the first power signal terminal;

an eighth switching element, a control terminal of the eighth switching element being coupled to the third clock signal terminal, a first terminal of the eighth switching element being coupled to the second power signal terminal, and a second terminal of the eighth switching element being coupled to the second node;

a ninth switching element, a control terminal of the ninth switching element being coupled to the third clock signal terminal, a first terminal of the ninth switching element being coupled to the pull-up node, and a second terminal of the ninth switching element being coupled to a tenth switching element; and the tenth switching element, a control terminal of the tenth switching element being coupled to the third clock signal terminal, a first terminal of the tenth switching element being coupled to the second terminal of the ninth switching element, and a second terminal of the tenth switching element being coupled to the first power signal terminal.

According to an aspect of the present disclosure, there is provided a gate drive circuit, which includes N cascade-connected shift register units according to any one of the above embodiments.

Excluding the first-stage shift register unit, an input signal of an input terminal of each stage of shift register unit is an output signal of a second output terminal of a previous-stage neighboring shift register unit.

Excluding the last-stage shift register unit, an output signal of a second output terminal of each stage of shift register unit is an input signal of an input terminal of a next-stage neighboring shift register unit.

According to an aspect of the present disclosure, there is provided a display device, which includes the gate drive circuit according to any one of the above embodiments.

According to an aspect of the present disclosure, there is provided a display device, which includes the shift register unit according to any one of the above embodiments.

BRIEF DESCRIPTION OF THE DRAWINGS

The above and other features and advantages of the present disclosure will become more apparent from the following description of exemplary embodiments with reference to the drawings, in which.

DETAILED DESCRIPTION

Figure 1:
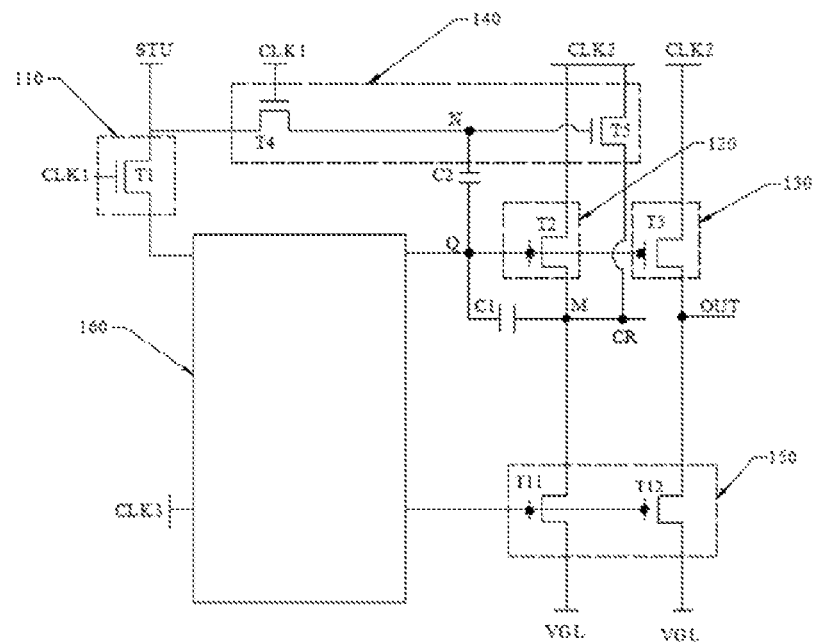
FIG. 1 is a schematic structural diagram of a shift register unit according to an exemplary embodiment of the present disclosure.

Exemplary embodiments will be described more comprehensively by referring to accompanying drawings now. However, the exemplary embodiments may be carried out in various manners and shall not be interpreted as being limited to the embodiments set forth herein. Instead, the provided embodiments will make the present disclosure more comprehensive and complete, and will fully convey the conception of the exemplary embodiments to those skilled in the art. Throughout the drawings, similar reference signs indicate the same or similar structures, and their detailed description will be omitted.

An exemplary embodiment provides a shift register unit, which may include: an input circuit 110, a first storage capacitor C1, a pull-up circuit 120, an output circuit 130, an auxiliary circuit 140, a second storage capacitor C2, and a pull-down circuit 150. The input circuit 110 is coupled to an input terminal, a pull-up node Q and a first clock signal terminal CLK1, and is configured to transmit an input signal to the pull-up node Q in response to a first clock signal. The first storage capacitor C1 is coupled between the pull-up node Q and a pull-down node M. The pull-up circuit 120 is coupled to the pull-up node Q, a second clock signal terminal CLK2, and a first output terminal CR, and is configured to transmit a second clock signal to the first output terminal CR in response to a signal from the pull-up node Q. The output circuit 130 is coupled to the second clock signal terminal CLK2, the pull-up node Q, and a second output terminal OUT, and is configured to transmit the second clock signal to the second output terminal OUT in response to the signal from the pull-up node Q. The auxiliary circuit 140 is coupled to the first clock signal terminal, the second clock signal terminal CLK2, the input terminal, and the first output terminal CR, and is configured to transmit the input signal to a first node N in response to the first clock signal and transmit the second clock signal to the first output terminal CR in response to a signal from the first node N. The second storage capacitor is coupled between the pull-up node Q and the first node N. The pull-down circuit 150 is coupled to a third clock signal terminal CLK3, a first power signal terminal VGL, the pull-down node and the second output terminal OUT, and is configured to transmit a first power signal to the pull-down node M and the second output terminal OUT in response to a third clock signal.

In this exemplary embodiment, the auxiliary circuit 140 is coupled to the second clock signal terminal CLK2, the pull-up node Q, and the second output terminal OUT. If one or more of the input circuit 110, the first storage capacitor C1, and the pull-up circuit 120 go wrong and thus, fail to work properly in an actual production process, or when the shift register unit is properly working, the second storage capacitor C2 matches up with the auxiliary circuit 140 to ensure a signal from the input terminal to be transmitted to the pull-up node Q, such that a signal from the second clock signal terminal CLK2 may be transmitted to the second output terminal OUT. Furthermore, a signal from the second clock signal terminal CLK2 may be transmitted to the first output terminal CR, such that a shift function of the shift register unit work properly, and thus, a display panel can display normally.

In this exemplary embodiment, the first clock signal is a signal inputted to the first clock signal terminal CLK1, the second clock signal is a signal inputted to the second clock signal terminal CLK2, and the third clock signal is a signal inputted to the third clock signal terminal CLK3.

Specific structures and connection relation of circuits in the shift register unit are described in detail below.

Referring to FIG. 1, the input circuit 110 may include a first switching element T1. A control terminal of the first switching element T1 is coupled to the first clock signal terminal CLK1, a first terminal of the first switching element T1 is coupled to the input terminal, and a second terminal of the first switching element T1 is coupled to the pull-up node Q.

The first storage capacitor C1 is coupled between the pull-up node Q and the pull-down node M.

The pull-up circuit 120 may include a second switching element T2. A control terminal of the second switching element T2 is coupled to the pull-up node Q, a first terminal of the second switching element T2 is coupled to the second clock signal terminal, and a second terminal of the second switching element T2 is coupled to the pull-down node M.

The output circuit 130 may include a third switching element T3. A control terminal of the third switching element T3 is coupled to the pull-up node Q, a first terminal of the third switching element T3 is coupled to the second clock signal terminal CLK2, and a second terminal of the third switching element T3 is coupled to the second output terminal OUT.

The auxiliary circuit 140 may include a fourth switching element T4 and a fifth switching element T5. A control terminal of the fourth switching element T4 is coupled to the first clock signal terminal, a first terminal of the fourth switching element T4 is coupled to the input terminal, and a second terminal of the fourth switching element T4 is coupled to the first node N. A control terminal of the fifth switching element T5 is coupled to the first node N, a first terminal of the fifth switching element T5 is coupled to the second clock signal terminal CLK2, and a second terminal of the fifth switching element T5 is coupled to the first output terminal CR.

The second storage capacitor C2 is coupled between the pull-up node Q and the first node N.

The pull-down circuit 150 may include an eleventh switching element T11 and a twelfth switching element T12. A control terminal of the eleventh switching element T11 is coupled to the third clock signal terminal CLK3, a first terminal of the eleventh switching element T11 is coupled to the pull-down node M, and a second terminal of the eleventh switching element T11 is coupled to the first power signal terminal VGL. A control terminal of the twelfth switching element T12 is coupled to the third clock signal terminal CLK3, a first terminal of the twelfth switching element T12 is coupled to the second output terminal OUT, and a second terminal of the twelfth switching element T12 is coupled to the first power signal terminal VGL.

In this exemplary embodiment, the first switching element to the fifth switching element (T1 to T5), the eleventh switching element T11, and the twelfth switching element T12 may respectively correspond to a first switching transistor to a fifth switching transistor, an eleventh switching transistor, and a twelfth switching transistor, wherein each switching transistor has a control terminal, a first terminal, and a second terminal. Specifically, the control terminal of each switching transistor may be a gate, the first terminal thereof may be a source, and the second terminal thereof may be a drain. Optionally, the control terminal of each switching transistor may be a gate, the first terminal thereof may be a drain, and the second terminal thereof may be a source. In addition, each of the switching transistors may be an enhancement transistor or a depletion transistor, which is not particularly limited by this exemplary embodiment. In addition, each of the switching transistors may be an N-type transistor or a P-type transistor, which is not particularly limited by this exemplary embodiment.

Referring to FIG. 1, if one or more of the first switching element T1, the second switching element T2 and the first storage capacitor C1 fail to work properly, the second storage capacitor C2 matches up with the auxiliary circuit 140 to ensure the shift register unit to work properly.

When the first switching element T1 fails to work properly, first, the fourth switching element writes an input signal into the first node N in response to the first clock signal to charge the second storage capacitor C2. Next, the voltage of the pull-up node Q is boosted by the second storage capacitor C2. Finally, the second switching element T2 transmits the second clock signal to the first output terminal CR in response to the voltage of the first node N, and the third switching element transmits the second clock signal to the second output terminal OUT in response to the voltage of the pull-up node Q.

When the second switching element T2 fails to work properly, first, the first switching element T1 transmits an input signal to the pull-up node Q in response to the first clock signal, and the third switching element T3 transmits the second clock signal to the second output terminal OUT in response to the signal from the pull-up node Q. Next, the fourth switching element T4 transmits the input signal to the first node N in response to the first clock signal, and the fifth switching element T5 transmits the second clock signal to the first output terminal CR in response to the signal from the first node N.

When the first storage capacitor C1 fails to work properly, a signal from the input terminal may be written into the first node N via the fourth switching element T4 to charge the second storage capacitor C2. The voltage of the pull-up node Q is boosted, such that the pull-up node Q is at a high level, then the third switching element T3 transmits the second clock signal to the first output terminal CR in response to the voltage of the pull-up node Q voltage, and the third switching element T3 transmits the second clock signal to the second output terminal OUT in response to the voltage of the pull-up node Q.

When both the first switching element T1 and the second switching element T2 fail to work properly, the input signal may be written into the first node N by the fourth switching element T4 in response to the first clock signal, and then the fifth switching element T5 transmits the second clock signal to the first output terminal CR in response to the signal from the first node N. Further, the voltage of the pull-up node Q is boosted by way of capacitive coupling, such that the third switching element T3 transmits the second clock signal to the second output terminal OUT in response to the signal from the pull-up node Q.

When both the first switching element T1 and the first storage capacitor C1 fail to work properly, or when both the second switching element T2 and the first storage capacitor C1 fail to work properly, the fourth switching element T4 may transmit an output signal to the first node N in response to the first clock signal. When the first node N is at a high level, the fifth switching element T5 is enabled, and a signal from the second clock signal terminal CLK2 may be transmitted to the first output terminal CR. Next, the second storage capacitor C2 is charged, and the voltage of the pull-up node Q is boosted by way of capacitive coupling, such that the pull-up node Q is at a high level, and thus the third switching element T3 may be enabled. That is, the third switching element T3 transmits a signal from the second clock signal terminal CLK2 to the second output terminal OUT in response to the signal from the pull-up node Q.

When none of the first switching element T1, the second switching element T2, and the first storage capacitor C1 work properly, first, the fourth switching element T4 may write an input signal into the first node N in response to the first clock signal, the first node N is at a high level, and the fifth switching element T5 is enabled, i.e., the fifth switching element T5 transmits a signal from the second clock signal terminal CLK2 to the first output terminal CR in response to the signal from the first node N. Next, the second storage capacitor C2 is charged, and the voltage of the pull-up node Q is boosted by way of capacitive coupling, such that the pull-up node Q is at a high level, and thus, the third switching element T3 may be enabled. That is, the third switching element T3 transmits the second clock signal to the second output terminal OUT in response to the voltage of the pull-up node Q.

The advantages of the present disclosure are more apparent by means of a specific embodiment with reference to a simulation timing diagram by comparing a case when circuits of the present disclosure work normally with a case when none of the first switching element T1, the second switching element T2 and the first storage capacitor C1 can work properly.

In this exemplary embodiment, the shift register unit further includes a control circuit. The control circuit is coupled to the pull-up node and the power signal terminal, and is configured to transmit the first power signal to the pull-up node in response to the third clock signal.

Figure 2:
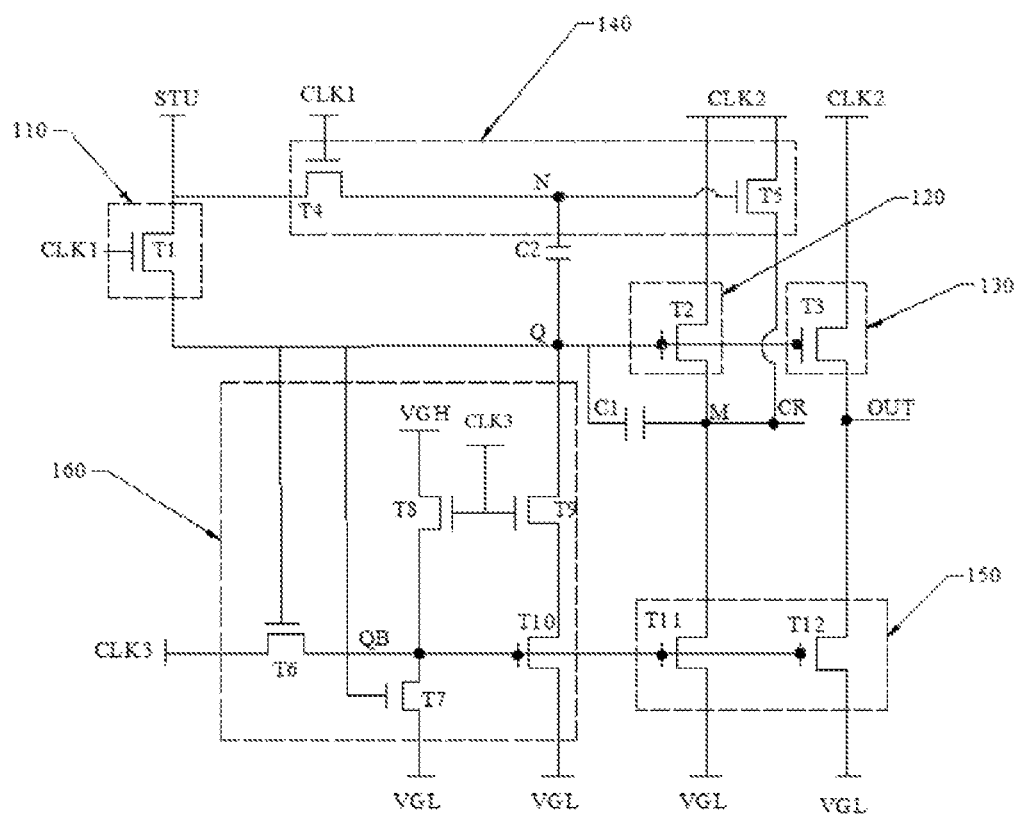
FIG. 2 is a schematic structural diagram of a control circuit in FIG. 1 according to an embodiment.

Referring to FIG. 2, the control circuit 160 may include a sixth switching element T6, a seventh switching element T7, an eighth switching element T8, a ninth switching element T9, and a tenth switching element.

A control terminal of the sixth switching element T6 is coupled to the pull-up node Q, a first terminal of the sixth switching element T6 is coupled to the third clock signal terminal CLK3, and a second terminal of the sixth switching element T6 is coupled to the second node QB.

A control terminal of the seventh switching element is coupled to the pull-up node Q, a first terminal of the seventh switching element is coupled to the second node, and a second terminal of the seventh switching element is coupled to the first power signal terminal VGL.

A control terminal of the eighth switching element T8 is coupled to the third clock signal terminal CLK3, a first terminal of the eighth switching element T8 is coupled to the second power signal terminal VGH, and a second terminal of the eighth switching element T8 is coupled to the second node QB.

A control terminal of the ninth switching element T9 is coupled to the third clock signal terminal CLK3, a first terminal of the ninth switching element T9 is coupled to the pull-up node Q, and a second terminal of the ninth switching element T9 is coupled to the tenth switching element T10.

A control terminal of the tenth switching element T10 is coupled to the second node QB, a first terminal of the tenth switching element T10 is coupled to the second terminal of the ninth switching element T9, and a second terminal of the tenth switching element T10 is coupled to the first power signal terminal VGL.

In this exemplary embodiment, the sixth switching element to the tenth switching element (T6 to T10) may respectively correspond to a sixth switching transistor to a tenth switching transistors, wherein each switching transistor has a control terminal, a first terminal, and a second terminal. Specifically, the control terminal of each switching transistor may be a gate, the first terminal thereof may be a source, and the second terminal thereof may be a drain. Optionally, the control terminal of each switching element may be a gate, the first terminal thereof may be a drain, and the second terminal thereof may be a source. In addition, each of the switching transistors may be an enhancement transistor or a depletion transistor, which is not particularly limited by this exemplary embodiment. In addition, each of the switching transistors may be an N-type transistor or a P-type transistor, which is not particularly limited by this exemplary embodiment.

Next, the working process of the shift register unit in FIG. 2 is described below by taking an example in which all switching elements are N-type thin film transistors. Because all the switching elements are N-type thin film transistors, ON signals of all the switching elements are high level signals, and OFF signals of all the switching elements are low level signals.

Figure 3:
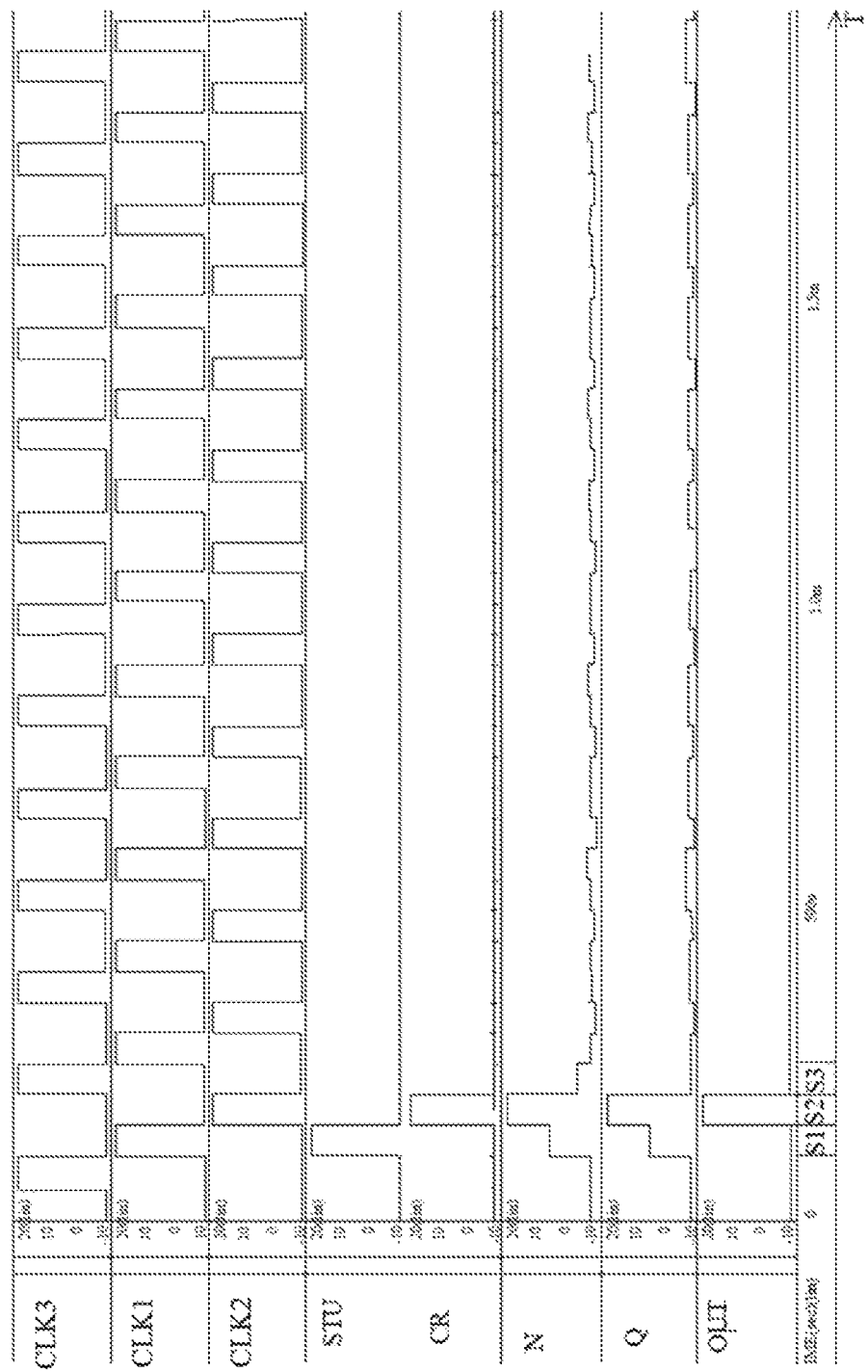
FIG. 3 is a schematic simulation timing diagram when a circuit structure in FIG. 2 properly functions.

In this exemplary embodiment, referring to FIG. 2 and FIG. 3, when all devices in the circuits work properly, it is as follows.

In a charging phase S1, both a signal from the first clock signal terminal CLK1 and a signal from the input terminal are high level signals; and both a signal from the second clock signal terminal CLK2 and a signal from the third clock signal terminal CLK3 are low level signals. At this moment, the first switching element T1 is enabled under the action of the high level signal from the input terminal, and the high level signal from the input terminal is transmitted to the pull-up node Q to charge the first storage capacitor C1.

In a bootstrap phase S2, a signal from the first clock signal terminal CLK1, a signal from the third clock signal terminal CLK3, and a signal from the input terminal are low level signals, and a signal from the second clock signal terminal CLK2 is a high level signal. A signal from the pull-up node Q is a high level signal under the action of the first storage capacitor C1, such that the second switching element T2 is enabled, and a signal from the second clock signal terminal CLK2 is transmitted to the first output terminal CR, i.e., a signal from the first output terminal CR is a high level signal. The signal from the pull-up node Q is a high level signal, such that the third switching element T3 is enabled, and the signal from the second clock signal terminal CLK2 is transmitted to the second output terminal OUT, such that a signal from the second output terminal OUT is a high level signal. In addition, due to the bootstrap action of the first storage capacitor C1, the voltage of the pull-up node Q is caused to rise to a high level the same as the signal from the second clock signal terminal CLK2.

In a pull-down phase S3, a signal from the third clock signal terminal CLK3 is a high level signal, but a signal from the input terminal, a signal from the first clock signal terminal CLK1 and a signal from the second clock signal terminal CLK2 are low level signals. The sixth switching element T6 is enabled under the action of the first storage capacitor C1, and meanwhile the tenth switching element T10 is enabled under the action of the high level signal from the third clock signal terminal CLK3, such that a signal from the first signal terminal VGL is transmitted to the pull-down node M, the second switching element T2 is disabled, and the first storage capacitor C1 is discharged. The twelfth switching element T12 is enabled under the action of the high level signal from the third clock signal terminal CLK3, and the signal from the first signal terminal VGL is transmitted to the second output terminal OUT, such that the third switching element T3 is disabled. At this moment, the first output terminal CR and the second output terminal OUT output low level signals.

When a high level occurs in the first clock signal for the first time, the first switching element T1 is enabled, the input signal is inputted to the pull-up node Q, the pull-up node Q is at a high level to charge the first storage capacitor C1. At the end of the high level of the first clock signal, a storage element provides a high level to the pull-up node, the second switching element T2 is enabled, the second clock signal is transmitted to the first output terminal CR, the third switching element T3 is enabled, and the second clock signal is transmitted to the second output terminal OUT. The pull-up node Q is at a high level, the sixth switching element is enabled, and when a high level occurs in the third clock signal, both the ninth switching element T9 and the tenth switching element T10 are enabled, and the first power signal is transmitted to the pull-up node Q to reset the first storage capacitor C1. The first power signal is transmitted to the pull-down node M by the eleventh switching element T11, such that the fifth switching element T5 is disabled, and the twelfth switching element T12 is enabled. The first power signal is transmitted to the second output terminal OUT, such that the third switching element T3 is disabled. In this way, resetting of the circuit is completed.

Figure 4:
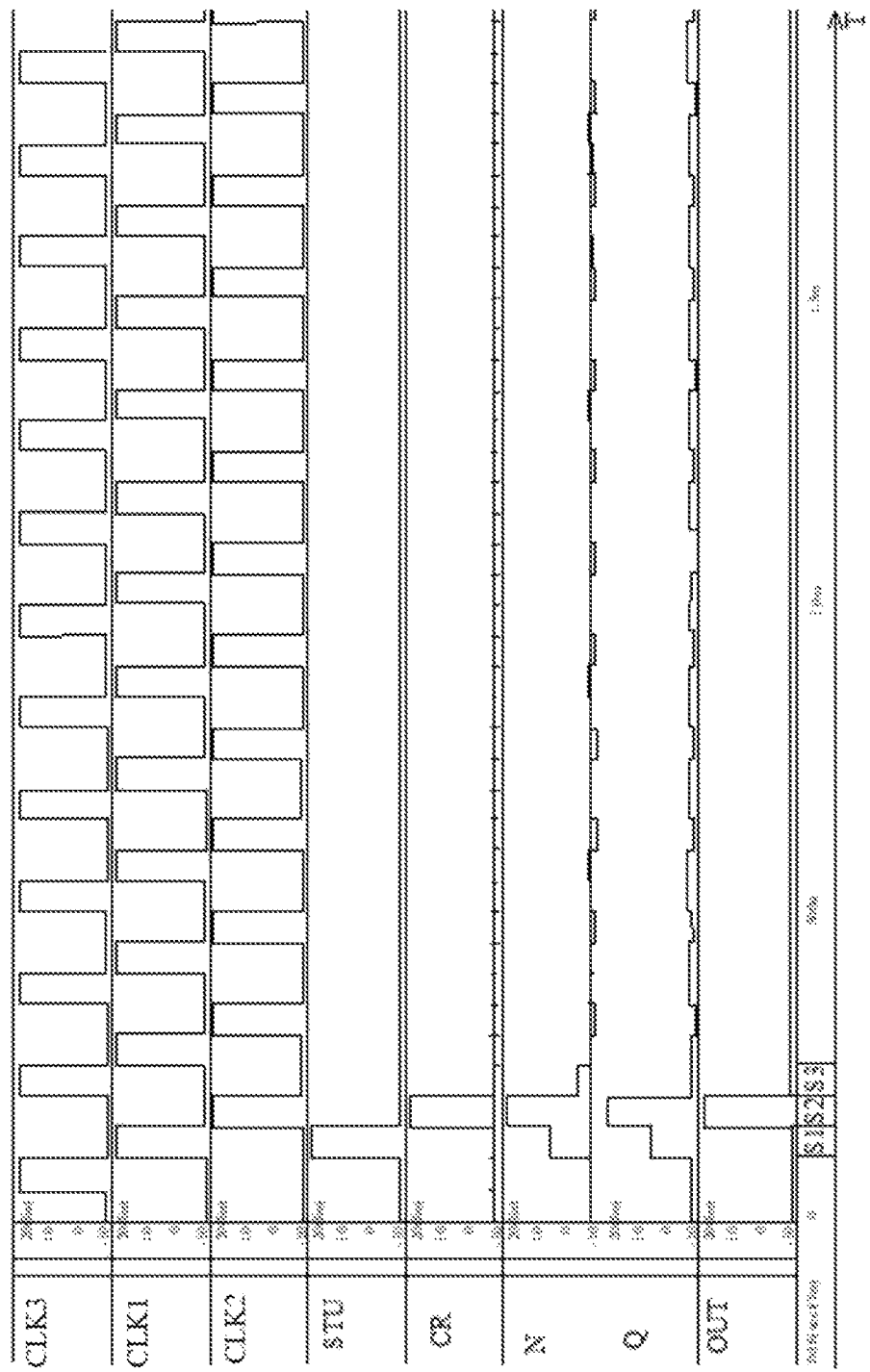
FIG. 4 is a schematic simulation timing diagram when none of a first switching element, a second switching element and a first storage capacitor in FIG. 2 can not properly work.

Referring to FIG. 2 and FIG. 4, when none of the first switching element, the second switching element and the first storage capacitor can work properly, their working processes are as follows.

In the charging phase S1, both a signal from the first clock signal terminal CLK1 and a signal from the input terminal are high level signals; and both a signal from the second clock signal terminal CLK2 and a signal from the third clock signal terminal CLK3 are low level signals. At this moment, the fourth switching element T4 is enabled under the action of the signal from the first clock signal terminal CLK1, such that the signal from the input terminal is transmitted to the first node to charge the second storage capacitor C2.

In the bootstrap phase S2, a signal from the first clock signal terminal CLK1, a signal from the third clock signal terminal CLK3 and a signal from the input terminal are low level signals, and a signal from the second clock signal terminal CLK2 is a high level signal. A voltage of the pull-up node Q is booted under the capacitive coupling action of the second storage capacitor C2, such that the signal from the pull-up node Q is a high level signal. The fifth switching element T5 is enabled under the action of the signal from the first node N, and a signal from the second clock signal terminal CLK2 is transmitted to the first output terminal CR, i.e., the first output terminal CR outputs a high level signal. The high level signal from the pull-up node Q causes the third switching element T3 to be enabled, and the signal from the second clock signal terminal CLK2 is transmitted to the second output terminal OUT, such that a signal from the second output terminal OUT is a high level signal. In addition, due to the bootstrap action of the second storage capacitor C2, the voltage of the pull-up node Q is caused to rise to a high level the same as the signal from the second clock signal terminal CLK2.

In the pull-down phase S3, a signal from the third clock signal terminal CLK3 is a high level signal, but a signal from the input terminal, a signal from the first clock signal terminal CLK1 and a signal from the second clock signal terminal CLK2 are low level signals. The sixth switching element T6 is enabled under the action of the first storage capacitor C1, and meanwhile, the eleventh switching element T11 is enabled under the action of the high level signal from the third clock signal terminal CLK3, a signal from the first signal terminal VGL is transmitted to the first output terminal CR, such that the third switching element T3 is disabled. Both the ninth switching element T9 and the tenth switching element T10 are enabled under the action of the signal from the third clock signal terminal CLK3, such that the signal from the first signal terminal VHL may be transmitted to the pull-up node Q to discharge the second storage capacitor C2. At this moment, the first output terminal CR and the second output terminal OUT output low level signals.

When a high level occurs in the first clock signal for the first time, the fourth switching element T4 is enabled, and the input signal is written into the first node N, such that the first node N and the pull-up node Q reach a high level at the end of the first high level of the first clock signal by means of bootstrap and capacitive coupling effect of the second storage capacitor C2, and the first node N is at the high level to charge the second storage capacitor C2. At the end of the high level of the first clock signal, the second storage capacitor C2 provides a high level to the first node N and the pull-up node Q. The first node N is at the high level, such that the fifth switching element T5 is enabled, and the second clock signal is transmitted to the first output terminal CR. The pull-up node Q is at the high level, such that the third switching element T3 is enabled, and the second clock signal is transmitted to the second output terminal OUT. The pull-up node Q is at a high level, the sixth switching element is enabled, and when a high level occurs in the third clock signal, both the ninth switching element T9 and the tenth switching element T10 are enabled, and the first power signal is transmitted to the pull-up node Q to reset the second storage capacitor C2. The first power signal is transmitted to the pull-down node M by the eleventh switching element T11, such that the fifth switching element T5 is disabled, and the twelfth switching element T12 is enabled. The first power signal is transmitted to the second output terminal OUT, such that the third switching element T3 is disabled. In this way, resetting of the circuit is completed.

As can be seen by comparison, when none of the first switching element T1, the second switching element T2 and the first storage capacitor C1 can properly work, the second storage capacitor C2 matches up with the auxiliary circuit 140 to ensure the circuit to work properly. That is, the shift function is not affected, and the normal display of a display panel is ensured.

Further, the present disclosure also provides a gate drive circuit, which may include N cascade-connected shift register units. The specific structures of the shift register units have been described above in detail, and thus their detailed descriptions are omitted herein.

Figure 5:
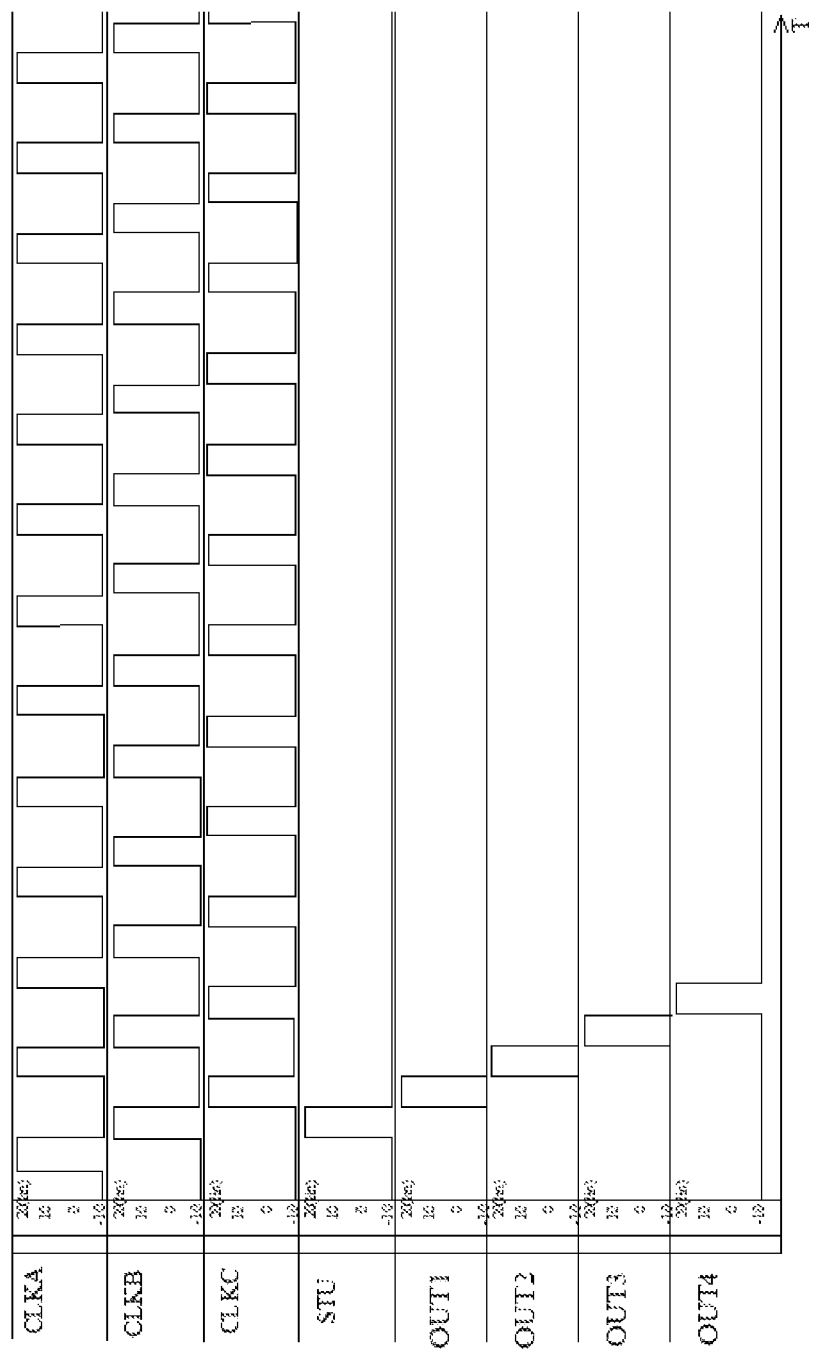
FIG. 5 is a schematic simulation timing diagram when circuits in FIG. 2 are cascade-connected.
Figure 6:
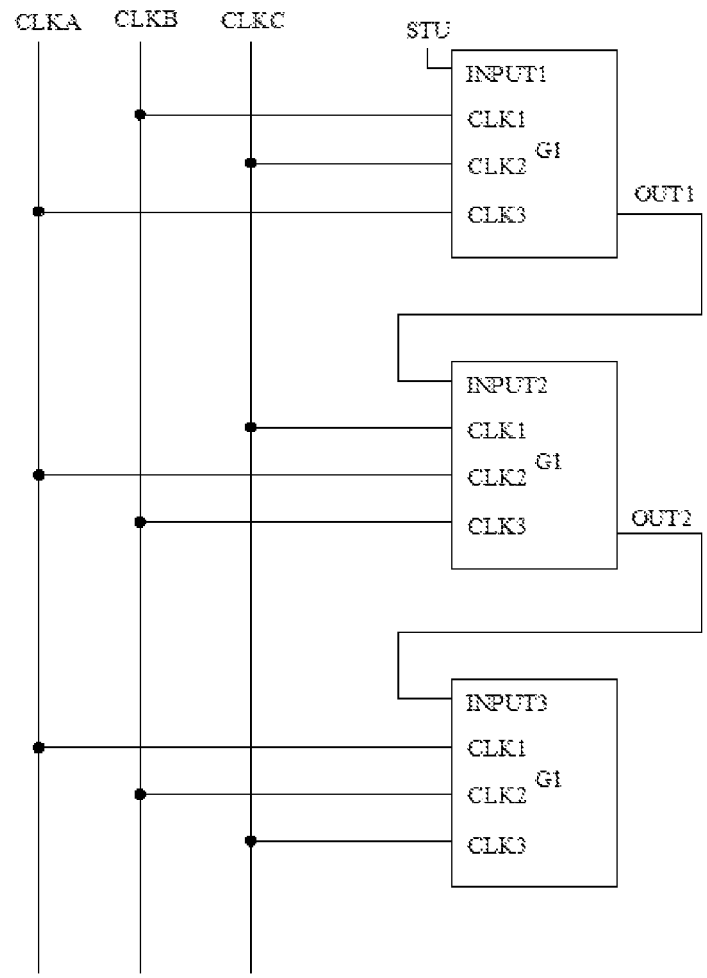
FIG. 6 is a schematic structural diagram of cascade-connected circuits in FIG. 2.

Referring to FIG. 5 and FIG. 6, there are provided three clock signal sources, i.e., a first clock signal source CLKA, a second clock signal source CLKB, and a third clock signal source CLKC. In a cascade connection, the first clock signal terminal CLK1 in a first stage G1 of the shift register unit is coupled to the second clock signal source CLKB, the second clock signal terminal CLK2 in the first stage G1 of the shift register unit is coupled to the third clock signal source CLKC, and the third clock signal terminal CLK3 in the first stage G1 of the shift register unit is coupled to the first clock signal source CLKA. The first clock signal terminal CLK1 in a second stage G2 of the shift register unit is coupled to the third clock signal source CLKC, the second clock signal terminal CLK2 in the second stage G2 of the shift register unit is coupled to the first clock signal source CLKA, and the third clock signal terminal CLK3 in the second stage G2 of the shift register unit is coupled to the second clock signal source CLKB. The first clock signal terminal CLK1 in a third stage G3 of the shift register unit is coupled to the first clock signal source CLKA, the second clock signal terminal CLK2 in the third stage G3 of the shift register unit is coupled to the second clock signal source CLKB, and the third clock signal terminal CLK3 in the third stage G3 of the shift register unit is coupled to the third clock signal source CLKC. A fourth stage is the same as the first stage G1, and so on. In this way, the cascade-connected shift register units may be obtained, and the output continuity of the cascade-connected shift register units may be ensured.

Excluding the first-stage G1 shift register unit, an input signal of an input terminal of each stage of shift register unit is an output signal of a second output terminal OUT of a previous-stage neighboring shift register unit.

Excluding the last-stage shift register unit, an output signal of a second output terminal OUT of each stage of shift register unit is an input signal of an input terminal of a next-stage neighboring shift register unit.

Moreover, the present disclosure also provides a display device, which may include the above-described gate drive circuit. The gate drive circuit includes the above-described shift register unit. The specific structure of the shift register unit has been described above in detail, and thus its detailed description is omitted herein.

The display device may be any product or component having a display function, such as a mobile phone, a tablet computer, a TV set, a notebook computer, a digital photo frame, a navigation device and so on.

The features, structures, or characteristics described above may be combined in one or more embodiments in any suitable manner, and the features discussed in each embodiment are interchangeable, if possible. Many concrete details are provided in the above descriptions to fully understand the embodiments of the present disclosure. However, those skilled in the art will realize that the technical solution for practice of the present disclosure has one or even more the specific details, or other methods, components, materials, and the like may be used. In other circumstances, well-known structures, materials, or operations are not shown or described in detail to avoid confusion of respective aspects of the present disclosure.

In this specification, the terms "one", "a", "said", "the" and "at least one" may be intended to indicate presence of one or more elements/constituent parts, etc. The terms "including", "comprising", and "having" are inclusive and therefore, specify the presence of other elements/constituent parts or the like in addition to the elements/constituent parts listed out. The terms "first", "second", "third" and so on are merely for marker purposes, and do not impose numerical limitations on objects thereof.

It is to be understood that the present disclosure is not limited in its application to the details of construction and the arrangement of the components set forth herein. The present disclosure can have other embodiments and can be performed by various embodiments. The foregoing variations and modifications fall within the scope of the present disclosure. It is to be understood that the present disclosure disclosed and defined in this specification extends to all alternative combinations of two or more individual features that are mentioned or apparent from the text and/or drawings. All of these different combinations constitute a plurality of alternative aspects of the present disclosure. The embodiments described in the specification are illustrative of the best mode for carrying out the present disclosure and will enable those skilled in the art to utilize the present disclosure.

What is claimed is:

1. A shift register unit, comprising:
an input circuit coupled to an input terminal, a pull-up node, and a first clock signal terminal, and configured to transmit an input signal to the pull-up node in response to a first clock signal;
a first storage capacitor coupled between the pull-up node and a pull-down node;
a pull-up circuit coupled to the pull-up node, a second clock signal terminal, and a first output terminal, and configured to transmit a second clock signal to the first output terminal in response to a signal from the pull-up node;
an output circuit coupled to the second clock signal terminal, the pull-up node, and a second output terminal, and configured to transmit the second clock signal to the second output terminal in response to the signal from the pull-up node;
an auxiliary circuit coupled to the first clock signal terminal, the second clock signal terminal, the input terminal, and the first output terminal, and configured to transmit the input signal to a first node in response to the first clock signal and transmit the second clock signal to the first output terminal in response to a signal from the first node;
a second storage capacitor coupled between the pull-up node and the first node; and
a pull-down circuit coupled to a third clock signal terminal, a first power signal terminal, the pull-down node, and the second output terminal, and configured to transmit a first power signal to the pull-down node and the second output terminal in response to a third clock signal.

2. The shift register unit according to claim 1, wherein the input circuit comprises: a first switching element, a control terminal of the first switching element being coupled to the first clock signal terminal, a first terminal of the first switching element being coupled to the input terminal, and a second terminal of the first switching element being coupled to the pull-up node.

3. The shift register unit according to claim 1, wherein the pull-up circuit comprises: a second switching element, a control terminal of the second switching element being coupled to the pull-up node, a first terminal of the second switching element being coupled to the second clock signal terminal, and a second terminal of the second switching element being coupled to the pull-down node.

4. The shift register unit according to claim 1, wherein the output circuit comprises: a third switching element, a control terminal of the third switching element being coupled to the pull-up node, a first terminal of the third switching element being coupled to the second clock signal terminal, and a second terminal of the third switching element being coupled to the second output terminal.

5. The shift register unit according to claim 1, wherein the auxiliary circuit comprises:
a fourth switching element, a control terminal of the fourth switching element being coupled to the first clock signal terminal, a first terminal of the fourth switching element being coupled to the input terminal, and a second terminal of the fourth switching element being coupled to the first node; and
a fifth switching element, a control terminal of the fifth switching element being coupled to the first node, a first terminal of the fifth switching element being coupled to the second clock signal terminal, and a second terminal of the fifth switching element being coupled to the first output terminal.

6. The shift register unit according to claim 1, wherein the pull-down circuit comprises:
an eleventh switching element, a control terminal of the eleventh switching element being coupled to the third clock signal terminal, a first terminal of the eleventh switching element being coupled to the pull-down node, and a second terminal of the eleventh switching element being coupled to the first power signal terminal; and
a twelfth switching element, a control terminal of the twelfth switching element being coupled to the third clock signal terminal, a first terminal of the twelfth switching element being coupled to the second output terminal, and a second terminal of the twelfth switching element being coupled to the first power signal terminal.

7. The shift register unit according to claim 1, further comprising: a control circuit coupled to the pull-up node and the first power signal terminal and configured to transmit the first power signal to the pull-up node in response to the third clock signal.

8. The shift register unit according to claim 7, wherein the control circuit comprises:
a sixth switching element, a control terminal of the sixth switching element being coupled to the pull-up node, a first terminal of the sixth switching element being coupled to the third clock signal terminal, and a second terminal of the sixth switching element being coupled to a second node;
a seventh switching element, a control terminal of the seventh switching element being coupled to the pull-up node, a first terminal of the seventh switching element being coupled to the second node, and a second terminal of the seventh switching element being coupled to the first power signal terminal;
an eighth switching element, a control terminal of the eighth switching element being coupled to the third clock signal terminal, a first terminal of the eighth switching element being coupled to a second power signal terminal, and a second terminal of the eighth switching element being coupled to the second node;
a ninth switching element, a control terminal of the ninth switching element being coupled to the third clock signal terminal, a first terminal of the ninth switching element being coupled to the pull-up node, and a second terminal of the ninth switching element being coupled to a tenth switching element; and
the tenth switching element, a control terminal of the tenth switching element being coupled to the third clock signal terminal, a first terminal of the tenth switching element being coupled to the second terminal of the ninth switching element, and a second terminal of the tenth switching element being coupled to the first power signal terminal.

9. A gate drive circuit, comprising N cascade-connected shift register units, wherein each of the N cascade-connected shift register units comprises:
an input circuit coupled to an input terminal, a pull-up node, and a first clock signal terminal, and configured to transmit an input signal to the pull-up node in response to a first clock signal;
a first storage capacitor coupled between the pull-up node and a pull-down node;
a pull-up circuit coupled to the pull-up node, a second clock signal terminal, and a first output terminal, and configured to transmit a second clock signal to the first output terminal in response to a signal from the pull-up node;
an output circuit coupled to the second clock signal terminal, the pull-up node, and a second output terminal, and configured to transmit the second clock signal to the second output terminal in response to the signal from the pull-up node;
an auxiliary circuit coupled to the first clock signal terminal, the second clock signal terminal, the input terminal, and the first output terminal and configured to transmit the input signal to a first node in response to the first clock signal and transmit the second clock signal to the first output terminal in response to a signal from the first node;
a second storage capacitor coupled between the pull-up node and the first node; and
a pull-down circuit coupled to a third clock signal terminal, a first power signal terminal, the pull-down node, and the second output terminal, and configured to transmit a first power signal to the pull-down node and the second output terminal in response to a third clock signal, wherein:
excluding a first-stage shift register unit, an input signal of an input terminal of each stage of a shift register unit is an output signal of a second output terminal of a previous-stage neighboring shift register unit; and
excluding a last-stage shift register unit, an output signal of a second output terminal of each stage of the shift register unit is an input signal of an input terminal of a next-stage neighboring shift register unit.

10. The gate drive circuit according to claim 9, wherein the input circuit comprises: a first switching element, a control terminal of the first switching element being coupled to the first clock signal terminal, a first terminal of the first switching element being coupled to the input terminal, and a second terminal of the first switching element being coupled to the pull-up node.

11. The gate drive circuit according to claim 9, wherein the pull-up circuit comprises: a second switching element, a control terminal of the second switching element being coupled to the pull-up node, a first terminal of the second switching element being coupled to the second clock signal terminal, and a second terminal of the second switching element being coupled to the pull-down node.

12. The gate drive circuit according to claim 9, wherein the output circuit comprises: a third switching element, a control terminal of the third switching element being coupled to the pull-up node, a first terminal of the third switching element being coupled to the second clock signal terminal, and a second terminal of the third switching element being coupled to the second output terminal.

13. The gate drive circuit according to claim 9, wherein the auxiliary circuit comprises:
a fourth switching element, a control terminal of the fourth switching element being coupled to the first clock signal terminal, a first terminal of the fourth switching element being coupled to the input terminal, and a second terminal of the fourth switching element being coupled to the first node; and
a fifth switching element, a control terminal of the fifth switching element being coupled to the first node, a first terminal of the fifth switching element being coupled to the second clock signal terminal, and a second terminal of the fifth switching element being coupled to the first output terminal.

14. The gate drive circuit according to claim 9, wherein the pull-down circuit comprises:
an eleventh switching element, a control terminal of the eleventh switching element being coupled to the third clock signal terminal, a first terminal of the eleventh switching element being coupled to the pull-down node, and a second terminal of the eleventh switching element being coupled to the first power signal terminal; and
a twelfth switching element, a control terminal of the twelfth switching element being coupled to the third clock signal terminal, a first terminal of the twelfth switching element being coupled to the second output terminal, and a second terminal of the twelfth switching element being coupled to the first power signal terminal.

15. The gate drive circuit according to claim 9, wherein the shift register unit further comprises: a control circuit coupled to the pull-up node and the first power signal terminal and configured to transmit the first power signal to the pull-up node in response to the third clock signal.

16. The gate drive circuit according to claim 15, wherein the control circuit comprises:
a sixth switching element, a control terminal of the sixth switching element being coupled to the pull-up node, a first terminal of the sixth switching element being coupled to the third clock signal terminal, and a second terminal of the sixth switching element being coupled to a second node;
a seventh switching element, a control terminal of the seventh switching element being coupled to the pull-up node, a first terminal of the seventh switching element being coupled to the second node, and a second terminal of the seventh switching element being coupled to the first power signal terminal;
an eighth switching element, a control terminal of the eighth switching element being coupled to the third clock signal terminal, a first terminal of the eighth switching element being coupled to a second power signal terminal, and a second terminal of the eighth switching element being coupled to the second node;
a ninth switching element, a control terminal of the ninth switching element being coupled to the third clock signal terminal, a first terminal of the ninth switching element being coupled to the pull-up node, and a second terminal of the ninth switching element being coupled to a tenth switching element; and
the tenth switching element, a control terminal of the tenth switching element being coupled to the third clock signal terminal, a first terminal of the tenth switching element being coupled to the second terminal of the ninth switching element, and a second terminal of the tenth switching element being coupled to the first power signal terminal.

17. A display device, comprising a gate drive circuit, wherein the gate drive circuit comprises N cascade-connected shift register units, and each of the N cascade-connected shift register units comprises:
an input circuit coupled to an input terminal, a pull-up node, and a first clock signal terminal, and configured to transmit an input signal to the pull-up node in response to a first clock signal;
a first storage capacitor coupled between the pull-up node and a pull-down node;
a pull-up circuit coupled to the pull-up node, a second clock signal terminal, and a first output terminal, and configured to transmit a second clock signal to the first output terminal in response to a signal from the pull-up node;
an output circuit coupled to the second clock signal terminal, the pull-up node, and a second output terminal, and configured to transmit the second clock signal to the second output terminal in response to the signal from the pull-up node;
an auxiliary circuit coupled to the first clock signal terminal, the second clock signal terminal, the input terminal, and the first output terminal and configured to transmit the input signal to a first node in response to the first clock signal and transmit the second clock signal to the first output terminal in response to a signal from the first node;
a second storage capacitor coupled between the pull-up node and the first node; and
a pull-down circuit coupled to a third clock signal terminal, a first power signal terminal, the pull-down node, and the second output terminal, and configured to transmit a first power signal to the pull-down node and the second output terminal in response to a third clock signal, wherein:
excluding a first-stage shift register unit, an input signal of an input terminal of each stage of shift register unit is an output signal of a second output terminal of a previous-stage neighboring shift register unit; and
excluding a last-stage shift register unit, an output signal of a second output terminal of each stage of shift register unit is an input signal of an input terminal of a next-stage neighboring shift register unit.

18. The display device according to claim 17, wherein the input circuit comprises: a first switching element, a control terminal of the first switching element being coupled to the first clock signal terminal, a first terminal of the first switching element being coupled to the input terminal, and a second terminal of the first switching element being coupled to the pull-up node.

19. The display device according to claim 17, wherein the pull-up circuit comprises: a second switching element, a control terminal of the second switching element being coupled to the pull-up node, a first terminal of the second switching element being coupled to the second clock signal terminal, and a second terminal of the second switching element being coupled to the pull-down node.

20. The display device according to claim 17, wherein the output circuit comprises:
a third switching element, a control terminal of the third switching element being coupled to the pull-up node, a first terminal of the third switching element being coupled to the second clock signal terminal, and a second terminal of the third switching element being coupled to the second output terminal.

* * * * *